United States Patent
Tanaka et al.

(10) Patent No.: US 8,877,697 B2
(45) Date of Patent: Nov. 4, 2014

(54) CLEANING AGENT FOR REMOVAL OF, REMOVAL METHOD FOR, AND CLEANING METHOD FOR WATER-SOLUBLE, LEAD-FREE SOLDER FLUX

(75) Inventors: Takashi Tanaka, Osaka (JP); Keita Tanaka, Osaka (JP); Yoshinobu Morino, Osaka (JP)

(73) Assignee: Arakawa Chemical Industries, Ltd., Osaka-shi (JP)

( * ) Notice: Subject to any disclaimer, the term of this patent is extended or adjusted under 35 U.S.C. 154(b) by 396 days.

(21) Appl. No.: 13/380,331

(22) PCT Filed: Aug. 20, 2010

(86) PCT No.: PCT/JP2010/064088
§ 371 (c)(1),
(2), (4) Date: Dec. 22, 2011

(87) PCT Pub. No.: WO2011/027673
PCT Pub. Date: Mar. 10, 2011

(65) Prior Publication Data
US 2012/0090646 A1    Apr. 19, 2012

(30) Foreign Application Priority Data
Sep. 3, 2009    (JP) .................................. 2009-203862

(51) Int. Cl.
| | | |
|---|---|---|
| C11D 7/50 | (2006.01) | |
| C11D 11/00 | (2006.01) | |
| C11D 7/26 | (2006.01) | |
| C23G 1/24 | (2006.01) | |
| H05K 3/26 | (2006.01) | |
| H05K 3/34 | (2006.01) | |

(52) U.S. Cl.
CPC ............ *C11D 11/0047* (2013.01); *C11D 7/263* (2013.01); *C11D 7/5022* (2013.01); *C23G 1/24* (2013.01); *H05K 3/26* (2013.01); *H05K 3/3489* (2013.01)
USPC .......................................... 510/175; 510/506

(58) Field of Classification Search
CPC ....... C11D 11/0047; C11D 7/263; C11D 3/43
USPC .................................. 510/175, 506
See application file for complete search history.

(56) References Cited

U.S. PATENT DOCUMENTS

| | | | |
|---|---|---|---|
| 5,256,209 A | 10/1993 | Chihara | |
| 7,704,939 B2 * | 4/2010 | Suzuki et al. ................. | 510/436 |
| 8,211,845 B2 * | 7/2012 | Tanaka et al. ................. | 510/175 |
| 8,372,792 B2 * | 2/2013 | Tanaka et al. ................. | 510/175 |
| 2004/0250919 A1 * | 12/2004 | Saito et al. ...................... | 148/25 |
| 2006/0223732 A1 | 10/2006 | Hori | |
| 2007/0167343 A1 * | 7/2007 | Suzuki et al. ................. | 510/329 |
| 2007/0235061 A1 * | 10/2007 | Mizuta et al. ..................... | 134/2 |
| 2008/0073414 A1 * | 3/2008 | Saito et al. ..................... | 228/244 |
| 2008/0132439 A1 * | 6/2008 | Itoi et al. ........................ | 510/506 |
| 2008/0305979 A1 | 12/2008 | Hori | |
| 2009/0042762 A1 * | 2/2009 | Zenfuku ......................... | 510/175 |
| 2010/0180917 A1 * | 7/2010 | Tanaka et al. .................... | 134/29 |
| 2011/0094545 A1 * | 4/2011 | Tanaka et al. .............. | 134/104.4 |

FOREIGN PATENT DOCUMENTS

| | | |
|---|---|---|
| JP | 4-57899 | 2/1992 |
| JP | 4-57900 | 2/1992 |
| JP | 7-97596 | 4/1995 |
| JP | 7-126695 | 5/1995 |
| JP | 8-73893 | 3/1996 |
| JP | 2005-112887 A1 | 4/2005 |
| JP | 2010-189635 A1 | 9/2010 |
| WO | WO 2005/021700 A1 | 4/2005 |
| WO | WO 2009/020199 A1 | 2/2009 |
| WO | WO 2010/024141 A1 | 3/2010 |

OTHER PUBLICATIONS

International Search Report for International Application No. PCT/JP2010/064088 dated Oct. 12, 2010.

\* cited by examiner

*Primary Examiner* — Gregory Webb
(74) *Attorney, Agent, or Firm* — Kratz, Quintos & Hanson, LLP

(57) ABSTRACT

An object of this invention is to provide a cleaner for the removal of water-soluble, lead-free soldering flux, the cleaner capable of cleaning off, in a short period of time, water-soluble flux residues generated during soldering with lead-free solder using water-soluble flux, the cleaner further having excellent dissolution property as well as excellent narrow gap cleaning property. The cleaner for removing water-soluble, lead-free soldering flux of the present invention comprises 5 to 100 parts by weight of a glycol ether compound (A) per 100 parts by weight of water.

12 Claims, No Drawings

CLEANING AGENT FOR REMOVAL OF, REMOVAL METHOD FOR, AND CLEANING METHOD FOR WATER-SOLUBLE, LEAD-FREE SOLDER FLUX

TECHNICAL FIELD

The present invention relates to a cleaner for removing water-soluble flux used in soldering with lead-free solder, a method for removing water-soluble, lead-free soldering flux, and a method for cleaning an object to be cleaned to which water-soluble, lead-free soldering flux is adhered.

BACKGROUND ART

Soldering is a general technique for surface mounting electronic components on the surface of a printed circuit board. In performing soldering, flux is generally used for the purpose of achieving sufficient solderability by removing an oxide film from the solder and the parent material surface or preventing the solder and the parent material surface from reoxidation. However, flux is corrosive, and flux residues decrease the quality of a printed circuit board. Therefore, in some cases, flux residues are removed by cleaning.

Heretofore, rosin-based flux (rosin flux) has widely been used in solder joints on surface-mounted components, and rosin flux residues would be cleaned off with a halogenated hydrocarbon such as so-called chlorofluorocarbon. However, because halogenated hydrocarbons are extremely harmful to the environment, the use thereof has been restricted. For this reason, various cleaners for removing rosin flux residues have been considered as a replacement for halogenated hydrocarbons, etc. For example, a cleaner containing, for example, polyoxyalkylene alkyl ether-based halogen-free organic solvent is suggested as having reduced ignition risk, reduced environmental effects, as well as an excellent property of dissolving rosin flux residues (see Patent Literature 1 to 3).

As a means to address environmental issues, cleaning with water in place of halogenated hydrocarbons has been considered. Fluxes that can be cleaned off with water include a water-soluble flux, in which an activator, a solvent, etc., are added to a polyether-based resin, etc., rather than hydrophobic fluxes, such as rosin fluxes. Water-soluble flux residues are hygroscopic, and must therefore be cleaned off. Such a feature of water-soluble flux residues differs from the feature of rosin flux residues, i.e., rosin flux residues do not necessarily need to be cleaned off. As such, the water-soluble flux residues are generally cleaned off with water; however, the cleaning can be insufficient.

In view of the above, as a cleaner for removing water-soluble flux residues, the use of the cleaners of, for example, Patent Literature 1-3, can be considered. However, these cleaners have not been studied for the purpose of removing water-soluble flux residues. In addition, it was difficult for the above-mentioned rosin flux cleaners to sufficiently clean off water-soluble flux residues, which have properties different from those of rosin flux residues.

CITATION LIST

Patent Literature

PTL 1: Japanese Unexamined Patent Publication No. H4-57899
PTL 2: Japanese Unexamined Patent Publication No. H8-73893
PTL 3: WO 2009/020199

SUMMARY OF INVENTION

Technical Problem

A principal object of the present invention is to provide a cleaner for the removal of water-soluble, lead-free soldering flux, the cleaner capable of cleaning off, in a short period of time, water-soluble flux residues generated during soldering with lead-free solder using water-soluble flux, the cleaner further having excellent dissolution property as well as excellent narrow gap cleaning property.

Solution to Problem

In order to solve the above-described problems, the present inventors conducted further research on cleaners for removing water-soluble flux. The inventors focused on the fact that some water-soluble fluxes cannot be cleaned off with water, although they should be able to. Then, the inventors considered that in cases where water-soluble flux is used, for example, in the current mainstay of lead-free soldering, difficulties in cleaning may possibly be caused by a high reflow temperature, an additive, or the like. Based on this idea, the inventors conducted studies on cleaners for removing water-soluble flux for lead-free soldering, and found that a mixture comprising a glycol ether compound and water in a specific ratio can reduce the cleaning time and have excellent dissolution property as well as gap cleaning property, even when the object to be cleaned is a mounting substrate, etc., which has a complicated and precise structure. The present invention is thereby accomplished.

Specifically, the present invention provides a cleaner for removing water-soluble, lead-free soldering flux, a method for removing water-soluble, lead-free soldering flux, and a method for cleaning an object to be cleaned to which water-soluble, lead-free soldering flux is adhered.

Item 1. A cleaner for removing water-soluble, lead-free soldering flux, comprising a glycol ether compound (A) and water, the glycol ether compound (A) being contained in an amount of 5 to 100 parts by weight per 100 parts by weight of water.

Item 2. The cleaner for removing water-soluble, lead-free soldering flux according to Item 1, wherein the cleaner comprises 5 to 45 parts by weight of the glycol ether compound (A) per 100 parts by weight of water.

Item 3. The cleaner for removing water-soluble, lead-free soldering flux according to Item 1 or 2, which further comprises:

an amine compound (B) represented by Formula (1):

(1)

wherein $R^1$ is $C_{1-7}$ alkyl or hydrogen, Y is $C_{1-5}$ alkyl or hydrogen, Z is $C_{1-5}$ alkyl or hydrogen, a is an integer of 1 to 5, and b is an integer of 0 to 5; and/or a chelating agent having no amino group (C).

Item 4. The cleaner for removing water-soluble, lead-free soldering flux according to any one of Items 1 to 3, wherein the glycol ether compound (A) is represented by Formula (2):

(2)

wherein $R^2$ is $C_{1-6}$ alkyl, $R^3$ is methyl or hydrogen, $R^4$ is $C_{1-5}$ alkyl or hydrogen, and c is an integer of 1 to 4.

Item 5. The cleaner for removing water-soluble, lead-free soldering flux according to any one of Items 1 to 4, wherein the glycol ether compound (A) exhibits a property of completely dissolving in water under conditions of a liquid temperature of 20° C. and a pressure of 100 kPa.

Item 6. The cleaner for removing water-soluble, lead-free soldering flux according to any one of Items 1 to 5, wherein the glycol ether compound (A) is at least one member selected from the group consisting of diethylene glycol monomethyl ether, triethylene glycol monomethyl ether, diethylene glycol monobutyl ether, triethylene glycol monobutyl ether, and dipropylene glycol monomethyl ether.

Item 7. The cleaner for removing water-soluble, lead-free soldering flux according to any one of Items 3 to 6, wherein the amine compound (B) is at least one member selected from the group consisting of N-methyldiethanolamine, N-ethyldiethanolamine, N-butyldiethanolamine, and N-propyldiethanolamine.

Item 8. The cleaner for removing water-soluble, lead-free soldering flux according to any one of Items 3 to 7, wherein the chelating agent having no amino group (C) is an aliphatic hydroxycarboxylic acid-based chelating agent and/or a (poly) phosphoric acid-based chelating agent.

Item 9. The cleaner for removing water-soluble, lead-free soldering flux according to Item 8, wherein the aliphatic hydroxycarboxylic acid-based chelating agent is at least one member selected from the group consisting of citric acid, isocitric acid, and malic acid.

Item 10. The cleaner for removing water-soluble, lead-free soldering flux according to Item 8, wherein the (poly)phosphoric acid-based chelating agent is at least one member selected from the group consisting of orthophosphoric acid, pyrophosphoric acid, and triphosphoric acid.

Item 11. The cleaner for removing water-soluble, lead-free soldering flux according any one of Items 3 to 10, wherein the cleaner comprises 0.1 to 10 parts by weight of the amine compound (B) and/or 0.04 to 4 parts by weight of the chelating agent having no amino group (C), per 100 parts by weight of water.

Item 12. The cleaner for removing water-soluble, lead-free soldering flux according to any one of Items 3 to 11, wherein the cleaner comprises the glycol ether compound (A), the amine compound (B), and the chelating agent having no amino group (C).

Item 13. A method for removing water-soluble, lead-free soldering flux, comprising bringing the cleaner for removing water-soluble, lead-free soldering flux of any one of Items 1 to 12 into contact with water-soluble, lead-free soldering flux.

Item 14. A method for cleaning an object to be cleaned to which water-soluble, lead-free soldering flux is adhered, comprising:

a cleaning step comprising bringing the cleaner for removing water-soluble, lead-free soldering flux of any one of Items 1 to 12 into contact with an object to be cleaned to which water-soluble, lead-free soldering flux is adhered, so as to remove the water-soluble, lead-free soldering flux from the object; and a water-rinsing step comprising roughly rinsing with water the object from which the water-soluble, lead-free soldering flux was removed, so as to clean off cleaner components adhering to the object.

Advantageous Effects of Invention

The cleaner for removing water-soluble, lead-free soldering flux of the present invention has enhanced safety and excellent property of dissolving water-soluble flux residues generated on an object to be cleaned that have been soldered with lead-free solder. The cleaner of the present invention can also efficiently remove the water-soluble flux residues adhering to micrometer-order narrow portions or gaps. For this reason, the cleaner for removing water-soluble, lead-free soldering flux of the present invention is particularly suitable for the cleaning of a printed-circuit board having a complicated and precise structure, such as a FC (Flip Chip) or BGA (Ball Grid Array) mounted board formed using a lead-free solder.

In the cleaning method and removing method of the present invention that use the cleaner for removing water-soluble, lead-free soldering flux of the present invention, the amount of the waste liquid resulting from pre-rinsing water used for rough rinsing can be reduced.

DESCRIPTION OF EMBODIMENTS

The cleaner for removing water-soluble, lead-free soldering flux of the present invention containing a glycol ether compound (A) (hereinafter referred to as "component (A)") and water is used to clean off water-soluble flux residues that are generated in soldering with lead-free solder using water-soluble flux, the cleaner containing 5 to 100 parts by weight of the component (A) per 100 parts by weight of water.

The cleaner of the present invention is used to clean off water-soluble flux residues. Examples of water-soluble flux residues include (i) a water-soluble flux residue generated as a result of soldering with a cream solder comprising lead-free solder powder and water-soluble flux; (ii) a water-soluble flux residue generated after electrodes are formed using a lead-free solder and the formed electrodes are soldered via water-soluble flux; and the like.

Examples of the lead-free solder include, but are not particularly limited to, Sn—Ag-based solder, Sn—Cu-based solder, Sn—Ag—Cu-based solder, Sn—Zn-based solder, Sn—Sb-based solder, and the like.

Specific examples of the water-soluble flux include a composition mainly containing, for example, a resin, an activator, and a solvent.

Examples of the resin include, but are not particularly limited to, polyethylene glycol, polypropylene glycol; copolymers thereof; derivatives thereof; polyglycerol ester compounds, triazine-based compounds, vinyl-containing compounds, carboxy-containing compounds, epoxy-containing compounds; and the like.

Examples of the activator include, but are not particularly limited to, halogenated compounds, organic acids, amine compounds, amine salts, amino acids, amide compounds, and the like. Examples of amine compounds include monoalkanolamine, dialkanolamine, trialkanolamine, and the like.

Examples of the solvent include, but are not particularly limited to, aliphatic alcohols, aromatic alcohols, glycols, polyhydric alcohols, and the like.

The cleaner for removing water-soluble, lead-free soldering flux of the present invention contains 5 to 100 parts by weight of the component (A) per 100 parts by weight of water. Thereby, the cleaner of the present invention exerts an excellent property of dissolving water-soluble flux residues generated on an object to be cleaned, enabling adequate removal of the water-soluble flux residues adhering to micrometer-order narrow portions or gaps.

The cleaner for removing water-soluble, lead-free soldering flux of the present invention contains water. Examples of the water contained in the cleaner include, but are not particularly limited to, pure water, ion exchange water, purified water, and the like.

The component (A) is not particularly limited and may be selected from various known glycol ether compounds, such as ethylene glycol-based ethers, propylene glycol-based ethers, and the like.

The cleaner for removing water-soluble, lead-free soldering flux of the present invention preferably contains 5 to 45 parts by weight of the component (A) per 100 parts by weight of water. Such a cleaner exerts a more excellent property of dissolving water-soluble flux residues generated on an object to be cleaned, thereby enabling satisfactory removal of the water-soluble flux residues adhering to micrometer-order narrow portions or gaps.

The component (A) is preferably a compound represented by Formula (2):

wherein $R^2$ is $C_{1-6}$ alkyl, $R^3$ is methyl or hydrogen, $R^4$ is $C_{1-5}$ alkyl or hydrogen, and c is an integer of 1 to 4.

Specific examples thereof include diethylene glycol monomethyl ether, diethylene glycol dimethyl ether, diethylene glycol monoethyl ether, diethylene glycol diethyl ether, diethylene glycol methyl ethyl ether, diethylene glycol monopropyl ether, diethylene glycol dipropyl ether, diethylene glycol methyl propyl ether, diethylene glycol ethyl propyl ether, diethylene glycol monobutyl ether, diethylene glycol dibutyl ether, diethylene glycol methyl butyl ether, diethylene glycol ethyl butyl ether, diethylene glycol propyl butyl ether, diethylene glycol monopentyl ether, diethylene glycol dipentyl ether, diethylene glycol methyl pentyl ether, diethylene glycol ethyl pentyl ether, diethylene glycol propyl pentyl ether, diethylene glycol butyl pentyl ether, diethylene glycol monohexyl ether, and like diethylene glycol ether compounds; monoethylene glycol monomethyl ether and like monoethylene glycol ether compounds; triethylene glycol monomethyl ether, triethylene glycol monobutyl ether, and like triethylene glycol ether compounds; tetraethylene glycol monomethyl ether and like tetraethylene glycol ether compounds; dipropylene glycol monomethyl ether, dipropylene glycol dimethyl ether, and like dipropylene glycol ether compounds; and the like. These may be used singly, or in a combination of two or more. Among them, diethylene glycol monomethyl ether, triethylene glycol monomethyl ether, diethylene glycol monobutyl ether, triethylene glycol monobutyl ether, dipropylene glycol monomethyl ether, dipropylene glycol dimethyl ether, diethylene glycol monohexyl ether, and diethylene glycol dibutyl ether are particularly preferable in terms of safety, and in terms of the property of dissolving flux residues as well as gap cleaning property.

It is preferable that the component (A) has the property of completely dissolving in water under conditions of a liquid temperature of 20° C. and a pressure of 100 kPa. Specific examples of the component (A) include diethylene glycol monomethyl ether, triethylene glycol monomethyl ether, diethylene glycol monobutyl ether, triethylene glycol monobutyl ether, dipropylene glycol monomethyl ether, and the like. When such a component (A) is used, the cleaner for removing water-soluble, lead-free soldering flux of the present invention exerts an excellent property of dissolving flux residues as well as gap cleaning property.

It is preferable that the cleaner for removing water-soluble, lead-free soldering flux of the present invention further comprises: an amine compound (B) (hereinafter referred to as "component (B)") represented by Formula (1):

wherein $R^1$ is $C_{1-7}$ alkyl or hydrogen, Y is $C_{1-5}$ alkyl or hydrogen, Z is $C_{1-5}$ alkyl or hydrogen, a is an integer of 1 to 5, and b is an integer of 0 to 5; and/or a chelating agent having no amino group (C) (hereinafter referred to as "component (C)").

The cleaner for removing water-soluble, lead-free soldering flux of the present invention may comprise any combination of the component (A) and water; the component (A), water, and the component (B); the component (A), water, and the component (C); or the component (A), water, the component (B), and the component (C).

Because water-soluble, lead-free soldering flux residues can contain an acid or base substance as an activator, the pH change is likely to be induced upon dissolution of the residues in the cleaner. However, incorporation of the component (B) and the component (C), in addition to the component (A) and water, into the cleaner causes a buffer action, which can minimize the pH change of the cleaner in the event that the water-soluble, lead-free soldering flux residues are dissolved in the cleaner. This results in the prevention of deterioration of the performance of the cleaner, allowing the cleaner to exert excellent flux cleaning ability. For this reason, a combination of the component (A), water, the component (B), and the component (C) is particularly preferable.

The component (B) is not limited, and may be selected from various known compounds. Specific examples thereof include ethanolamine, N-methylethanolamine, N-ethylethanolamine, N-propylethanolamine, N-butylethanolamine, N-(t-butyl)ethanolamine, N,N-dimethylethanolamine, N,N-diethylethanolamine, N,N-dibutylethanolamine, and like monoethanolamine compounds; diethanolamine, N-methyldiethanolamine, N-ethyldiethanolamine, N-butyldiethanolamine, N-propyldiethanolamine, N-(t-butyl)diethanolamine, and like diethanolamine compounds; and the like. These may be used singly, or in a combination of two or more. Among them, diethanolamine compounds are preferable; particularly, at least one member selected from the group consisting of N-methyldiethanolamine, N-ethyldiethanolamine, N-butyldiethanolamine, and N-propyldiethanolamine is preferable in terms of excellent safety, particularly in terms of the contamination-prevention property and low-foaming property.

The component (C) is not particularly limited as long as it is a chelating agent having no amino group in the molecule, and may be selected from various known compounds. In particular, an aliphatic hydroxycarboxylic acid-based chelating agent and/or a (poly)phosphoric acid-based chelating agent is preferable in terms of the contamination-prevention property.

Specific examples of the aliphatic hydroxycarboxylic acid-based chelating agent include a hydroxy carboxylic acid, which is formed of a straight chain alkyl group having a carbon number of about 2 to 5 as its basic structure; and about 2 to 3 carboxyl groups and about 1 to 3 hydroxy groups bonded thereto. Examples of hydroxy carboxylic acids include citric acid, isocitric acid, malic acid, tartaric acid, salts thereof, and the like. Examples of the salts include sodium salts, potassium salts, ammonium salts, alkanolamine salts, and the like. Among them, in terms of the contamination-prevention property, at least one member selected from the group consisting of citric acid, isocitric acid, and malic acid is preferable, and citric acid is particularly preferable.

Examples of the (poly)phosphoric acid-based chelating agent include orthophosphoric acid, pyrophosphoric acid, triphosphoric acid, salts thereof, and the like. Examples of the salts include sodium salts, potassium salts, ammonium salts, alkanolamine salts, and the like. Among them, in terms of the contamination-prevention property, at least one member selected from the group consisting of orthophosphoric acid, pyrophosphoric acid, and triphosphoric acid is preferable, and pyrophosphoric acid is particularly preferable.

If a chelating agent having an amino group in the molecule is used instead of the component (C), the object to be cleaned is likely to be re-contaminated during the water-rinsing step. For this reason, in the case where a chelating agent is added to the cleaner for removing water-soluble, lead-free soldering flux of the present invention, it is preferable that the above-described chelating agent that has no amino group be used, rather than a chelating agent having an amino group in the molecule (e.g., ethylenediaminetetraacetic acid or 2-hydroxyethyliminodiacetic acid).

The cleaner for removing water-soluble, lead-free soldering flux of the present invention preferably contains about 0.1 to 10 parts by weight of the component (B) and/or about 0.04 to 4 parts by weight of the component (C), per 100 parts by weight of water. It is more preferable that the amount of the component (B) is about 1 to 10 parts by weight and the amount of the component (C) is about 0.6 to 4 parts by weight. With this amount range, the viscosity of the cleaner can be lowered while maintaining the property of dissolving lead-free solder flux, thereby improving the gap cleaning property.

The cleaner for removing water-soluble, lead-free soldering flux of the present invention may also contain another halogen-free organic solvent, in addition to the component (A), if necessary. Specific examples of other halogen-free organic solvents include nitrogen-containing compound-based solvents (1,3-dimethyl-2-imidazolidinone, 1,3-diethyl-2-imidazolidinone, 1,3-dipropyl-2-imidazolidinone, N-methyl-2-pyrrolidone, and the like), alcohol-based solvents (methanol, ethanol, benzyl alcohol), and the like), ketone-based solvents (acetone, methyl ethyl ketone, and the like), ether-based solvents (diethyl ether, tetrahydrofuran, glycol ether, and the like), ester-based solvents (ethyl acetate, methyl acetate, and the like), and the like. These may be used singly, or in a combination of two or more.

The cleaner for removing water-soluble, lead-free soldering flux of the present invention may contain various types of known additives insofar as the effects of the present invention are not impaired. Examples of the additives include nonionic surfactants (excluding those that are used as the component (A) or the component (B)), anionic surfactants, cationic surfactants and like various types of surfactants; antifoaming agents, anti-rust agents, antioxidants, and the like.

Examples of the nonionic surfactants include compounds represented by Formula (3):

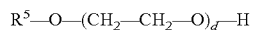

wherein $R^5$ represents $C_{8-20}$ alkyl and d is an integer of 0 to 20, and polyoxypropylene-based surfactants thereof; ethylene oxide adducts of fatty acid amides, sorbitan fatty acid esters, sucrose fatty acid esters, fatty acid alkanolamide, and polyoxypropylene-based surfactants thereof; and the like. These may be used singly, or in a combination of two or more.

Specific examples of the anionic surfactants include sulfuric acid ester-based anionic surfactants (higher alcohol sulfuric acid ester salts, alkylsulfuric acid ester salts, polyoxyethylene alkylsulfuric acid ester salts, and the like), sulfonic acid salt-based anionic surfactants (alkylsulfonic acid salts, alkylbenzene sulfonic acid salts, and the like), and the like. These may be used singly, or in a combination of two or more.

Specific examples of the cationic surfactants include alkylated ammonium salts, quaternary ammonium salts, and the like. Examples of amphoteric surfactants include amino acid amphoteric surfactants and betaine amphoteric surfactants. These may be used singly, or in a combination of two or more.

By bringing the cleaner for removing water-soluble, lead-free soldering flux of the present invention into contact with water-soluble, lead-free soldering flux adhering to an object to be cleaned, the water-soluble, lead-free soldering flux can be removed. Therefore, the present invention provides a method for removing water-soluble, lead-free soldering flux, the method comprising bringing the cleaner for removing water-soluble, lead-free soldering flux into contact with the water-soluble, lead-free soldering flux adhering to an object to be cleaned. There is no limitation to the method for bringing the cleaner for removing water-soluble, lead-free soldering flux into contact with water-soluble, lead-free soldering flux, and various known methods may be employed. Specific examples thereof include a method for spraying the cleaner onto an object to be cleaned to which water-soluble, lead-free soldering flux is adhered by means of a spray device; a method for immersing an object to be cleaned in the cleaner and subjecting the object to ultrasonic cleaning; a method performed with the use of a direct cleaning device (e.g., Direct Pass™, product of Arakawa Chemical Industries, Ltd.: Japanese Patent No. 2621800); and the like.

A cleaning method of the present invention, which uses the cleaner for removing water-soluble, lead-free soldering flux of the present invention, comprises:

a cleaning step comprising bringing the cleaner for removing water-soluble, lead-free soldering flux into contact with an object to be cleaned to which water-soluble, lead-free soldering flux is adhered, so as to remove the water-soluble, lead-free soldering flux from the object; and a water-rinsing step comprising roughly rinsing with water the object from which the water-soluble, lead-free soldering flux was removed, so as to clean off cleaner components adhering to the object.

Cleaning an object with the use of the cleaner for removing water-soluble, lead-free soldering flux may be conducted by using, for example, a cleaning device equipped with a cleaning tank and a pre-rinsing tank.

In the cleaning tank, an object is cleaned by using the cleaner for removing water-soluble, lead-free soldering flux of the present invention. In the cleaning tank, the water-soluble flux undergoes dissolution, allowing the removal thereof from the object.

The pre-rinsing tank is used after the cleaning tank. In the pre-rinsing tank, the cleaner components adhering to the object are roughly rinsed with water, and the cleaner components containing water-soluble flux are peeled off from the object.

In the removing method and cleaning method of the present invention, which use the cleaner for removing water-soluble, lead-free soldering flux of the present invention, the amount of the waste liquid resulting from pre-rinsing water used for rough rinsing can be greatly reduced, compared with the case where a cleaner for removing rosin flux residues is used. The reason therefor is explained below.

Pre-rinsing water before being used for the cleaning is water. Upon increase in frequencies of the cleaning of rosin flux residues using a cleaner, the concentration of the cleaner in the pre-rinsing water gradually increases. When the concentration of the cleaner in pre-rinsing water reaches a certain level or more, the pre-rinsing water is usually discarded and replaced with fresh water. One of the features of the cleaner for removing water-soluble, lead-free soldering flux of the present invention is that it contains water at a higher ratio, and thus the concentration of the cleaner is low. Therefore, even when cleaning is repeatedly performed, the concentration of the cleaner in pre-rinsing water is not easily increased. For this reason, the cleaner of the present invention can greatly reduce the amount of the waste liquid resulting from pre-rinsing water, compared with a cleaner for removing rosin flux residues, which contains water at a lower ratio.

EXAMPLES

Hereinafter, the present invention is described in more detail, with reference to Examples. However, the present invention is not limited to the Examples. In the Examples, "%" and "parts" represent "percent by weight" and "parts by weight", respectively, unless otherwise particularly specified.

Preparation of Cleaner

The components shown in Table 1 were mixed (on parts by weight basis), and the cleaners of the Examples and Comparative Examples were prepared.

The abbreviations used in Table 1 indicate the following:
BDG: Diethylene glycol monobutyl ether
BTG: Triethylene glycol monobutyl ether
DMFDG: Dipropylene glycol dimethyl ether
MBD: N-butyldiethanolamine
CA: Citric acid
MA: Malic acid
PA: Pyrophosphoric acid Production of Sample for Evaluation of Water-Soluble Flux Cleaning Ability 0.1 g each of commercially available water-soluble flux (1) (product name: Sparkle Flux WF-6070; produced by Senju Metal Industry Co., Ltd.) and water-soluble flux (2) (product name: ALPHA WS-3018; produced by Cookson Electronics Co.) were respectively applied to Cu test pieces (0.3×40×40 mm), and heated for 30 seconds on a hot plate at 270° C. in atmospheric air. The thus-obtained water-soluble flux residues were used as samples for evaluation of the water-soluble flux cleaning ability.

Production of Sample for Evaluation of Gap Cleaning Property

A solder resist test board (1.0×40×40 mm) on which solder bumps (bump diameter; 120 µm; bump height: 30 µm; pitch: 180 µm) were arranged in a 60×60 (pieces) array in an almost square shape was used. The water-soluble flux (1) or (2) was applied to the bumps, and transparent glass chips (0.5×16×16

TABLE 1

|  | Water | A BDG | A BTG | A DMFDG | B MBD | B Monoethanolamine | C c1 CA | C c1 MA | C c2 PA |
|---|---|---|---|---|---|---|---|---|---|
| Ex. 1 | 100 | 5.26 | | | | | | | |
| Ex. 2 | 100 | 7.53 | | | | | | | |
| Ex. 3 | 100 | 11.1 | | | | | | | |
| Ex. 4 | 100 | 25.0 | | | | | | | |
| Ex. 5 | 100 | 42.9 | | | | | | | |
| Ex. 6 | 100 | 66.7 | | | | | | | |
| Ex. 7 | 100 | 92.3 | | | | | | | |
| Ex. 8 | 100 | 12.5 | 12.5 | | | | | | |
| Ex. 9 | 100 | 12.5 | | 12.5 | | | | | |
| Ex. 10 | 100 | | 25.0 | | | | | | |
| Ex. 11 | 100 | | 12.5 | 12.5 | | | | | |
| Ex. 12 | 100 | | | 25 | | | | | |
| Ex. 13 | 100 | 25.0 | | | 0.188 | | | | |
| Ex. 14 | 100 | 25.0 | | | 1.25 | | | | |
| Ex. 15 | 100 | 25.0 | | | 9.38 | | | | |
| Ex. 16 | 100 | 25.0 | | | | 1.25 | | | |
| Ex. 17 | 100 | 25.0 | | | | | 0.0750 | | |
| Ex. 18 | 100 | 25.0 | | | | | 0.625 | | |
| Ex. 19 | 100 | 25.0 | | | | | 3.75 | | |
| Ex. 20 | 100 | 25.0 | | | | | | 0.625 | |
| Ex. 21 | 100 | 25.0 | | | | | | | 0.625 |
| Ex. 22 | 100 | 25.0 | | | 1.25 | | 0.625 | | |
| Comp. Ex. 1 | 100 | | | | | | | | |
| Comp. Ex. 2 | 100 | 1.01 | | | | | | | |
| Comp. Ex. 3 | 100 | 3.09 | | | | | | | |
| Comp. Ex. 4 | 100 | 150 | | | | | | | |
| Comp. Ex. 5 | 100 | 233 | | | | | | | |
| Comp. Ex. 6 | 100 | 400 | | | | | | | |
| Comp. Ex. 7 | 100 | 900 | | | | | | | |
| Comp. Ex. 8 | | 100 | | | | | | | | mm) were bonded and connected to the top portions of the bumps. The samples were heated for 20 seconds in a reflow furnace at a peak temperature of 260° C. The thus-obtained flux residues were used as samples for evaluation of gap cleaning property.

Test 1: Evaluation of Water-Soluble Flux Cleaning Ability

The samples for the evaluation of water-soluble flux cleaning ability were introduced into the stirring cleaners of the Examples and the Comparative Examples that had been heated to 40° C., and the time required to remove the water-soluble flux residues was measured. Whether the water-soluble flux residues were removed was determined by visual inspection depending on whether the water-soluble flux residues were eliminated.

1: Required Time was less than 80 s
2: Required Time was 80 s or more and less than 100 s
3: Required Time was 100 s or more and less than 200 s
4: Required Time was 200 s or more and less than 400 S
5: Required Time was 400 s or more and less than 600 s
6: Required Time was 600 s or more Test 2: Evaluation of Gap Cleaning Property A cleaning test was carried out using the samples for the evaluation of gap cleaning property under predetermined cleaning conditions, and the flux residue removal performance was evaluated. At this time, whether the flux residues remained or were removed was visually determined via the transparent glass chips.

Cleaning Conditions
Cleaning method: A direct cleaning device (e.g., Direct Pass™, product of Arakawa Chemical Industries, Ltd.: Japanese Patent No. 2621800)
Cleaning step: Cleaning liquid—the cleaning liquids of the Examples and the Comparative Examples; Liquid temperature: 70° C.;
Time: 9 min; Flow rate: 0.66 m/s
Rinsing step: Rinsing liquid; deionized water; Liquid temperature: 40° C.; Time: 1 min; Flow rate: 0.66 m/s
Drying: method: hot-air drying method; Temperature: 80° C.; Time: 15 min
Criteria of Cleaning Evaluation
A: Removal of the flux residues was possible
B: Removal of the flux residues was insufficient Table 2 shows the results of Tests 1 and 2.

TABLE 2

|  | Flux Cleaning Ability | | Gap Cleaning Property | |
| --- | --- | --- | --- | --- |
|  | WF-6070 | WS-3018 | WF-6070 | WS-3018 |
| Ex. 1 | 3 | 2 | A | A |
| Ex. 2 | 3 | 2 | A | A |
| Ex. 3 | 3 | 2 | A | A |
| Ex. 4 | 3 | 2 | A | A |
| Ex. 5 | 3 | 2 | A | A |
| Ex. 6 | 4 | 4 | A | A |
| Ex. 7 | 4 | 4 | A | A |
| Ex. 8 | 3 | 2 | A | A |
| Ex. 9 | 3 | 3 | A | A |
| Ex. 10 | 3 | 2 | A | A |
| Ex. 11 | 3 | 3 | A | A |
| Ex. 12 | 4 | 3 | A | A |
| Ex. 13 | 2 | 2 | A | A |
| Ex. 14 | 2 | 2 | A | A |
| Ex. 15 | 2 | 2 | A | A |
| Ex. 16 | 3 | 2 | A | A |
| Ex. 17 | 2 | 2 | A | A |
| Ex. 18 | 2 | 2 | A | A |
| Ex. 19 | 2 | 2 | A | A |
| Ex. 20 | 2 | 2 | A | A |
| Ex. 21 | 2 | 2 | A | A |
| Ex. 22 | 1 | 1 | A | A |
| Comp. Ex. 1 | 6 | 2 | B | A |
| Comp. Ex. 2 | 6 | 2 | B | A |
| Comp. Ex. 3 | 6 | 2 | B | A |
| Comp. Ex. 4 | 5 | 4 | B | B |
| Comp. Ex. 5 | 5 | 4 | B | B |
| Comp. Ex. 6 | 5 | 5 | B | B |
| Comp. Ex. 7 | 6 | 6 | B | B |
| Comp. Ex. 8 | 6 | 6 | B | B |

The terms used in Table 2 indicate the following:
WF-6070: Water soluble flux (1) (product name Sparkle Flux WF-6070, produced by Senju Metal Industry Co., Ltd.)
WS-3018: Water-soluble flux (2) (product name ALPHA WS-3018, produced by Cookson Electronics Co.)

The invention claimed is:

1. A cleaner for removing water-soluble, lead-free soldering flux, comprising:
a glycol ether compound (A);
an amine compound (B) represented by Formula (1):

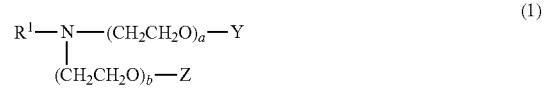

wherein $R^1$ is $C_{1-7}$ alkyl or hydrogen, Y is $C_{1-5}$ alkyl or hydrogen, Z is $C_{1-5}$ alkyl or hydrogen, a is an integer of 1 to 5, and b is an integer of 0 to 5; and
water,
the glycol ether compound (A) being contained in an amount of 5 to 45 parts by weight per 100 parts by weight of water, the amine compound (B) being contained in an amount of 0.1 to 10 parts by weight per 100 parts by weight of water, and the cleaner being free from anionic surfactants.

2. The cleaner for removing water-soluble, lead-free soldering flux according to claim 1, which further comprises:
a chelating agent having no amino group (C) in an amount of 0.04 to 4 parts by weight per 100 parts by weight of water.

3. The cleaner for removing water-soluble, lead-free soldering flux according to claim 1,
wherein the glycol ether compound (A) is represented by Formula (2):

wherein $R^2$ is $C_{1-6}$ alkyl, $R^3$ is methyl or hydrogen, $R^4$ is $C_{1-5}$ alkyl or hydrogen, and c is an integer of 1 to 4.

4. The cleaner for removing water-soluble, lead-free soldering flux according to claim 1, wherein the glycol ether compound (A) exhibits a property of completely dissolving in water under conditions of a liquid temperature of 20° C. and a pressure of 100 kPa.

5. The cleaner for removing water-soluble, lead-free soldering flux according to claim 1, wherein the glycol ether compound (A) is at least one member selected from the group consisting of diethylene glycol monomethyl ether, triethylene glycol monomethyl ether, diethylene glycol monobuthyl ether, triethylene glycol monobuthyl ether, and dipropylene glycol monomethyl ether.

6. The cleaner for removing water-soluble, lead-free soldering flux according to claim 2, wherein the amine compound (B) is at least one member selected from the group consisting of N-methyldiethanolamine, N-ethyldiethanolamine, N-buthyldiethanolamine, and N-propyldiethanolamine.

7. The cleaner for removing water-soluble, lead-free soldering flux according to claim 2, wherein the chelating agent having no amino group (C) is an aliphatic hydrocarboxylic acid-based chelating agent and/or a (poly)phosphoric acid-based chelating agent.

8. The cleaner for removing water-soluble, lead-free soldering flux according to claim 7, wherein the aliphatic hydrocarboxylic acid-based chelating agent is at least one member selected from the group consisting of citric acid, isocitric acid, and malic acid.

9. The cleaner for removing water-soluble, lead-free soldering flux according to claim 7, wherein the (poly)phosphoric acid-based chelating agent is at least one member selected from the group consisting of orthophosphoric acid, pyrophosphoric acid, and triphosphoric acid.

10. The cleaner for removing water-soluble, lead-free soldering flux according to claim 2, wherein the cleaner comprises the glycol ether compound (A), the amine compound (B), and the chelating agent having no amino group (C).

11. A method for removing water-soluble, lead-free soldering flux, comprising
bringing the cleaner for removing water-soluble, lead-free soldering flux of claim 1 into contact with water-soluble, lead-free soldering flux.

12. A method for cleaning an object to be cleaned to which water-soluble, lead-free soldering flux is adhered, comprising:
a cleaning step comprising bringing the cleaner for removing water-soluble, lead-free soldering flux of claim 1 into contact with an object to be cleaned to which water-soluble, lead-free soldering flux is adhered, so as to remove the water-soluble, lead-free soldering flux from the object; and
a water-rinsing step comprising roughly rinsing with water the object from which the water-soluble, lead-free soldering flux was removed, so as to clean off cleaner components adhering to the object.

\* \* \* \* \*